United States Patent
Kamp et al.

(10) Patent No.: US 6,658,608 B1
(45) Date of Patent: Dec. 2, 2003

(54) APPARATUS AND METHOD FOR TESTING FERROELECTRIC MEMORIES

(76) Inventors: David A. Kamp, 2925 Lake Meadow Dr., Monument, CO (US) 80132-7920; Gary F. Derbenwick, 1626 Vickers Dr., Colorado Springs, CO (US) 80918

( * ) Notice: Subject to any disclaimer, the term of this patent is extended or adjusted under 35 U.S.C. 154(b) by 0 days.

(21) Appl. No.: 09/400,210

(22) Filed: Sep. 21, 1999

(51) Int. Cl.⁷ .............................................. G11C 29/00
(52) U.S. Cl. ..................... 714/718; 365/145; 257/295
(58) Field of Search ............................ 714/718, 815, 714/720; 365/200–203, 145, 195, 65, 89.01, 210, 306, 49, 170, 149, 189.07, 207, 532; 711/151, 149, 168; 257/213, 295; 438/3

(56) References Cited

U.S. PATENT DOCUMENTS

| | | | |
|---|---|---|---|
| 4,418,403 A | | 11/1983 | O'Toole et al. |
| 4,707,897 A | | 11/1987 | Rohrer et al. |
| 5,155,658 A | * | 10/1992 | Inam et al. ................. 365/145 |
| 5,265,056 A | | 11/1993 | Butler et al. |
| 5,337,279 A | | 8/1994 | Gregory et al. |
| 5,610,867 A | | 3/1997 | DeBrosse et al. |
| 5,661,730 A | * | 8/1997 | Mitra et al. ................. 365/201 |
| 5,751,944 A | * | 5/1998 | Roohparvar et al. ........... 714/42 |
| 5,815,430 A | * | 9/1998 | Verhaeghe et al. ......... 365/145 |
| 5,825,782 A | | 10/1998 | Roohparvar |
| 6,031,754 A | * | 2/2000 | Derbenwick et al. ....... 365/145 |
| 6,031,755 A | * | 2/2000 | Ozawa ....................... 365/145 |
| 6,055,200 A | * | 4/2000 | Choi et al. .................. 365/201 |
| 6,256,220 B1 | * | 7/2001 | Kamp ....................... 365/145 |

FOREIGN PATENT DOCUMENTS

EP 0 920 032 6/1999

OTHER PUBLICATIONS

Auciello et al. (The Physics of Ferroelectric Memories; PHYSICS today, pp. 22–27; Jul. 1998).*

* cited by examiner

*Primary Examiner*—Albert Decady
*Assistant Examiner*—Guy Lamarre (57) ABSTRACT

A ferroelectric integrated circuit memory device includes: a plurality of memory cells, each including a ferroelectric material, a plurality of conducting lines, each connected to or connectable to a selected one of the memory cells; a drive circuit for applying a predetermined voltage for a predetermined time to a selected one of the conducting lines, the predetermined voltage and time being the normal voltage and time required to perform write or read functions to the memory cell, a function selected from the group of: writing a logic state to the selected memory cell, and reading the selected memory cell; and a mode control circuit responsive to an external signal for adjusting the predetermined voltage or the predetermined time to perform an operation selected from the group consisting of: a partial read of the selected memory cell, and a partial write of the selected memory cell; and applying ferroelectric stress to the memory cell. A known logic state is written to the memory cells, the cells are heated, and then read to provide output data indicative of the likelihood of premature failure for each of the memory cells. Ferroelectric stress is applied to the cells either before or after the cells are written to by repeatedly applying a voltage to the cells corresponding to a logic state opposite that of the written logic state.

35 Claims, 3 Drawing Sheets

APPARATUS AND METHOD FOR TESTING FERROELECTRIC MEMORIES

BACKGROUND OF THE INVENTION

1. Field of the Invention

The present invention relates to ferroelectric integrated circuit memory devices, and more particularly to apparatus and methods for testing such memories.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is a non-volatile ferroelectric random access memory in which each memory cell contains at least one ferroelectric capacitor and at least one switch. These are referred to by several different acronyms, such as NVRAM, FeRAM, FRAM, and FERAM. We shall refer to such memories as FERAMS herein. However, other ferroelectric memories are also known, such as memories in which each memory cell is a ferroelectric field effect transistor (ferroelectric FET), and memories in which each cell consists of a single ferroelectric capacitor, sometimes referred to as a "raw array" or cross point array because it is simply an array formed by rows and columns or conductors with a ferroelectric between the conductors where they cross. See, for example, J. R. Scott, C. A. Paz De Araujo, and L. D. McMillan, "Integrated Ferroelectrics", in *Condensed Matter News*, Vol. 1, No. 3, pp. 15–20, 1992 for a discussion of the ferroelectric FET, and U.S. Pat. No. 4,707,897 issued to George A. Roher and Larry McMillan on Nov. 24, 1987, for a discussion of the raw array. Some projections suggest that the market for ferroelectric memories may be about ten billion dollars by the year 2002. See "A Computer In Every Shirt Collar", *Forbes*, Mar. 8, 1999.

Non-volatile memories, such as ferroelectric memories, should be able to retain data for at least ten years under worst case conditions, such as elevated temperature and repeated pulsing and/or switching of a single memory cell. In the last few years, substantial progress has been made in overcoming historical problems of failure of ferroelectric memories, such as ferroelectric fatigue. See Auciello et al., *Supra*, at pp. 23–25. However, in all memories, including ferroelectric memories, individual memory cells may fail prematurely. Some of the failure mechanisms of ferroelectric memories, such as defects in the transistor or transistors associated with each memory cell, e.g. anomalously shifted threshold voltage or anomalously shifted transistor gain, and defects in passive devices, such as anomalous contact window resistance, anomalous leakage current, insulator dielectric breakdown, and inadequate isolation between electronic devices, are related to failure mechanisms in conventional memories, such as dynamic random access memories (DRAMS). However, other failure mechanisms in ferroelectric memories, such as anomalous ferroelectric fatigue, anomalous imprinting, and anomalous shifting of parameters such as coercive voltage and polarizability, are unique to ferroelectric memories. Since these are also the failure mechanisms for which there is little experience in predicting, it would be highly useful to have apparatus and methods for determining and isolating individual memory cells and/or individual memory chips which will fail prematurely.

One type of test that is often used in testing electronic devices is called a "margin test". A "margin test" is generally any test which determines circuit weaknesses and potential malfunctions by varying the operating conditions of the circuitry. Typical operating conditions that are varied can include supply voltage and frequency of the applied electronic signal. Margin tests for determining and isolating individual memory cells in conventional electronic memories, such as DRAMS, are well-known. See, for example, U.S. Pat. No. 5,265,056 issued to James E. O'Toole and Robert J. Proebstling on Nov. 29, 1983; U.S. Pat. No. 5,265,056 issued to Edward Butler et al. on Nov. 23, 1993; U.S. Pat. No. 5,610,867 issued to John K. DeBrosse et al. on Mar. 11, 1997; and U.S. Pat. No. 5,825,782 issued to Frankie F. Roohparvar on Oct. 20, 1998. However, no margin test that can isolate failures related to the unique properties of ferroelectric memories has yet been devised.

SOLUTION

The invention solves the above problem by providing a margin test, and margin test apparatus, that permits the determination of individual ferroelectric memory cells and individual ferroelectric memory chips which will fail prematurely due to failure mechanisms that are unique to ferroelectric memories. An important aspect of the invention is the application of ferroelectric stress to ferroelectric memory cells in combination with a write and a read process which determines which of the cells may prematurely fail. In another key aspect, the invention comprises a method of testing an integrated circuit memory device comprising a plurality of memory cells, each cell including a ferroelectric material having a coercive voltage, the method including two or more processes selected from the group consisting of: applying a ferroelectric stress to the memory cells, performing a partial write on said memory cells, heating the memory cells, and performing a partial read of said memory cells. The invention usually comprises other steps also, such as an analysis step in which the results of the test are used to accept, reject, isolate, or repair cells which may be subject to premature failure.

The invention also solves the above problems by providing a ferroelectric memory device that includes circuits for determining which cells may prematurely fail due to failure mechanisms that are unique to ferroelectric memories. The ferroelectric memory device includes a test circuit for applying voltages to memory cells in the memory to perform one or more of the following functions: applying ferroelectric stress to the memory cells; performing a partial write of memory cells; and performing a partial read of memory cells.

The invention provides a method of testing a ferroelectric integrated circuit memory device comprising a plurality of memory cells, each including a ferroelectric material having a coercive voltage, the method comprising: writing a known logic state to the memory cells; applying ferroelectric stress to the memory cells; and reading the memory cells to provide output data indicative of the likelihood of premature failure for each of the memory cells. Preferably, the step of applying ferroelectric stress comprises applying a voltage pulse to the memory cells. Preferably, the step of applying a voltage pulse comprises a step selected from the group consisting of: repeatedly applying to the cells a voltage at or above the coercive voltage, and repeatedly applying to the cells a voltage lower than the coercive voltage. Preferably, the step of applying comprises the step of repeatedly applying to the cells a voltage at or above the coercive voltage and corresponding to a first logic state, and the step of writing comprises writing to a second logic state opposite to the first logic state. Preferably, the step of reading comprises performing a partial read of each of the memory cells. Preferably, the step of performing a partial read comprises a step selected from the group consisting of: reading the cells with a voltage lower than the normal read voltage for the memory cells, placing a read voltage across the ferroelectric material for a period of time that is shorter than the normal read time for the memory cells, and sensing the read output signal with a narrower than normal sense voltage window. Preferably, the memory includes a plurality of plate lines and a plurality of bit lines and the step of reading the cells with a voltage lower than the normal read voltage comprises a step selected from the group consisting of: changing the plate line voltage, and changing the bit line precharge voltage. Preferably, the step of writing comprises writing each of the cells to a first logic state and the step of applying comprises the first step of repeatedly applying to the cells a voltage below the coercive voltage and corresponding to a second logic state different from the first logic state. Preferably, the step of reading the cells to provide output data includes the step of recording the number of the first repetitions required for each of the cells to fail to read the first logic state in the read step. Preferably, the method further includes the steps of rewriting the memory cells to the first logic state, heating the memory cells, a second step of repeatedly applying to the cells a voltage below the coercive voltage and corresponding to a second logic state different than the first logic state, and a second step of reading the cells and recording the number of the second repetitions required for each of the cells to read the first logic state in the second read step. Preferably, the method also includes the step of comparing the number of the first repetitions to the number of the second repetitions and accepting, rejecting or repairing the memory device based on the comparison. Preferably, the method further includes the step of heating the plurality of memory cells. Preferably, the step of writing comprises performing a partial write of each of the memory cells. Preferably, the method further includes the step of accepting, rejecting or repairing the memory device based on the output data.

In another aspect, the invention provides a method of testing a ferroelectric integrated circuit memory device comprising a plurality of memory cells, each including a ferroelectric material, the method comprising: partially writing a known state to the memory cells; heating the memory cells; and reading the memory cells to provide output data indicative of the likelihood of premature failure for each of the memory cells. Preferably, the step of partially writing comprises a step selected from the group consisting of: writing the known value to the cells with a voltage lower than the normal write voltage for the memory cells; placing a write voltage across the ferroelectric material for a period of time that is shorter than the normal write time for the memory cells; and sensing a read output signal with a narrower than normal sense voltage window. Preferably, the step of reading comprises performing a partial read of each of the memory cells.

In a further aspect, the invention provides a method of testing a ferroelectric integrated circuit memory device comprising a plurality of memory cells, each including a ferroelectric material, the method comprising: writing a known state to the memory cells; heating the memory cells; and partially reading the memory cells to provide output data indicative of the likelihood of premature failure for each of the memory cells. Preferably, the step of partially reading comprises a step selected from the group consisting of: reading the cells with a voltage lower than the normal read voltage for the memory cells; placing a read voltage across the ferroelectric material for a period of time that is shorter than the normal read time for the memory cells; and sensing the read output signal with a narrower than normal sense voltage window. Preferably, the step of writing comprises performing a partial write of each of the memory cells.

The invention also provides a ferroelectric integrated circuit memory device comprising: a plurality of memory cells, each of the memory cells including a ferroelectric material; a plurality of conducting lines, each of the lines connected to or connectable to a selected one of the memory cells; a drive circuit for applying a predetermined voltage for a predetermined time to a selected one of the lines, the predetermined voltage and time being the normal voltage and time required to perform a function selected from the group of: writing a logic state to the selected memory cell, and reading the selected memory cell; and a mode control circuit responsive to an external signal for adjusting the predetermined voltage or the predetermined time to perform an operation selected from the group consisting of: a partial read of the selected memory cell; a partial write of the selected memory cell; and applying ferroelectric stress to the memory cell. Preferably, the conducting lines comprise plate lines; the predetermined voltage comprises a plate line voltage; and the drive circuit comprises a plate line drive circuit. Preferably, the mode control circuit comprises a voltage control circuit for lowering the plate line voltage. Preferably, the conducting lines further include word lines for carrying a word line signal, and the mode control circuit comprises a timing control circuit for changing the timing of the word line signal. Preferably, the conducting lines comprise bit lines; the predetermined voltage comprises a precharge voltage; and the drive circuit comprises a bit line precharge circuit. Preferably, the mode control circuit comprises a voltage control circuit for raising the precharge voltage. Preferably, the conducting lines comprise sense amplifier voltage lines; the predetermined voltage comprises a sense amp voltage; and the drive circuit comprises a sense amplifier voltage drive circuit. Preferably, the conducting lines comprise a high sense amplifier voltage line and a low sense amplifier voltage line; the sense amplifier voltage includes a high sense amplifier voltage and a low sense amplifier voltage; and the mode control circuit comprises a voltage control circuit for narrowing the voltage window between the high sense amplifier voltage and the low sense amplifier voltage. Preferably, the conducting lines include word lines for carrying a word line signal and the mode control circuit comprises a timing control circuit for changing the timing of the word line signal.

The invention not only provides methods and devices for testing unique failure mechanisms of a ferroelectric memory, but the methods are also practical in that they typically can be performed overnight, even for memories with a million or more memory cells. In addition, the tests are relatively simple so that circuits to perform the tests can be incorporated into a ferroelectric memory without adding undue complexity to the memory. Numerous other features, objects and advantages of the invention will become apparent from the following description when read in conjunction with the accompanying drawings.

DETAILED DESCRIPTION OF THE PREFERRED EMBODIMENT

The present invention now will be described more fully with reference to the accompanying drawings, in which embodiments of the invention are shown. Those skilled in the art will appreciate that the invention may be embodied in many different forms than those shown and described and should not be construed as limited to the embodiments set forth herein; rather, these embodiments are provided so that this disclosure will be thorough, complete, and clear and will fully convey the scope of the invention to those skilled in the art. In the drawings, like numbers refer to like elements throughout.

As known in the art, ferroelectric memories are based on the fact that a ferroelectric material will assume a first polarization state if an electric field, or voltage, equal to or higher than the coercive voltage is placed across the ferroelectric material in one direction, and will assume the opposite polarization state if an electric field, or voltage, equal to or higher than the coercive voltage is placed across the ferroelectric material in the opposite direction. These polarizations will remain for periods up to a hundred years or more unless disturbed by another electric field, or voltage. If a single voltage pulse less than the coercive voltage is placed across the ferroelectric material, the material either will not switch, or only a portion of the ferroelectric domains in the material will switch. If many pulses lower than the threshold voltage but higher than some nominal voltage are placed across the material, the majority of the ferroelectric domains in the material will generally eventually switch.

Figure 1:
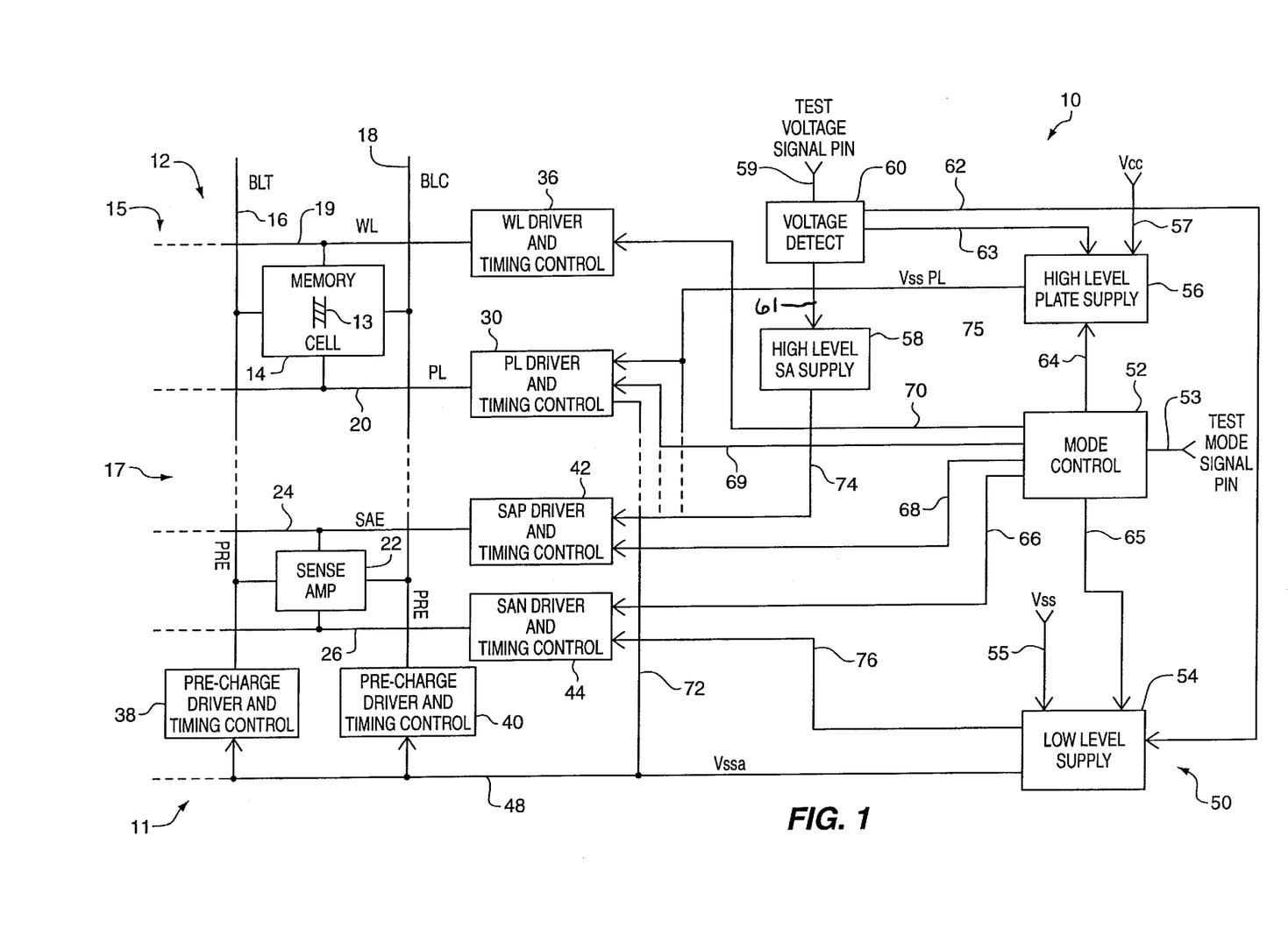
FIG. 1 shows a preferred embodiment of a ferroelectric integrated circuit memory according to the invention.

A ferroelectric integrated circuit 10 according to the invention is shown in FIG. 1. For ease of understanding, integrated circuit 10 can be divided into a memory portion 11 and a memory test control portion 50, although, as will be seen in more detail below, some components of memory portion 11 include circuits that assist in application of the test signals also. As known in the art, memory portion 11 includes an array 12 of memory cells 14 and associated circuitry to be described below. The dotted lines 15 are intended to represent additional columns of memory cells and circuitry associated with the memory cell columns, while the dotted lines 17 are intended to represent additional rows of memory cells and circuitry associated with the memory cell rows. Memory cell 14 is preferably a two transistor/two capacitor memory cell, which is known in the art, though the invention can be applied to a memory utilizing a one transistor/one capacitor memory cell or any other type of ferroelectric memory cell. To indicate that memory cell 14 is intended to comprise any type of memory cell, the detailed cell structure is not shown, and ferroelectric material 13 is shown only generally in the cell. Associated with each column of memory cells are a pair of conducting lines 16 and 18, conventionally called bit lines, which carry the signals BLT and BLC, respectively. Associated with each row of memory cells is a conducting line 19, conventionally called a word line, and a conducting line 20, conventionally called a plate line, which carry the signals WL and PL, respectively. The details of memory cell 14 and the connection of bit lines 16 and 18, word line 19, and plate line 20 to the electronic elements of the memory cell are known in the art and will not be described in detail herein. In the embodiment shown in FIG. 1, a sense amplifier 22 is associated with each row of memory cell 14 and is electrically connected between bit lines 16 and 18. Precharge driver circuits 38 and 40 are connected to bit lines 16 and 18, respectively, and, as known in the art, provide a precharge signal, PRE, on bit lines 16 and 18 during specific portions of the memory cycle, usually at the beginning and end of the cycle. Sense amplifier 22 is also connected between high voltage sense amplifier conducting line 24, which, as known in the art, carries the sense amplifier enable signal, SAE, and low voltage sense amplifier conducting line 26. Word line 19 is connected to and driven by word line driver and timing control 36. Plate line 20 is connected to and driven by plate line driver and timing control 30. High voltage sense amplifier line 24 is connected to and driven by sense amplifier positive line driver and timing control 42. Low voltage sense amplifier line 26 is connected to and driven by sense amplifier negative line driver and timing control 44.

The above describes a conventional architecture for a ferroelectric memory, except that, as will be seen below, drivers 30, 36, 38, 40, 42 and 44 contain additional circuitry that permits their output to be adjusted via test circuitry 50. As known in the art, word line driver and timing control 36 applies a signal, WL, to word line 19 which controls switches in memory cell 14 which connect and disconnect it from bit line lines 16 and 18. Plate line driver and timing control 30 applies a write signal to the plate of ferroelectric capacitors in memory cell 14 during the write cycle of memory 10 and a read signal to the plate of the capacitors during the read cycle of memory 10. As known in the art, during the write cycle, a logic "1" or logic "0" signal is applied to bit lines 16 and 18 (by drivers which are not shown), which, together with the signal on plate line 20, creates a write voltage across ferroelectric material 13 in memory cell 14 which writes the corresponding logic state to the memory cell. Precharge driver and timing control circuits 38 and 40 precharge their respective bit lines, preferably to the low voltage signal, at the beginning of a read cycle of memory 10. As known in the art, the read signal applied to plate line 20 together with the precharged bit lines causes ferroelectric material 13 to switch if the memory is in one logic state and ferroelectric material 13 not to switch if it is in the opposite logic state. This causes one of bit lines 16 and 18 to rise to a slightly higher read output voltage than the other bit line. Sense amplifier high voltage driver and timing control circuit 42 applies a high voltage of logic "1" signal to one input of sense amplifier 22 during the read cycle and sense amplifier low voltage driver and timing control circuit 42 applies a low voltage or logic "0" signal to one input of sense amplifier 22 during the read cycle. This causes sense amplifier 22 to drive the one of bit lines 16 and 18 that has developed the slightly higher read output voltage than the other to a high voltage of logic "1" state and drives the other bit line to the low or logic "0" state. As known in the art, the assignation of a logic "1" to the high state and a logic "0" to the low state is arbitrary and the opposite assignment is also possible. As known in the art, all the voltages described in the above paragraph have predetermined voltage values, which preferably can be within a narrow range of voltages, at which the memory is designed to operate. We shall refer to these predetermined voltage values as the "normal" voltage; e.g., the predetermined read voltage of plate line 20 at which the memory is designed to operate is the "normal read voltage", and the predetermined plate line write voltage at which the circuit is designed to operate is the "normal write voltage". Likewise, each of the above normal voltages are applied for a predetermined time during the corresponding cycle, and this time is referred to as the "normal" time; e.g., the predetermined time for which the normal read voltage is applied is the "normal read time", etc. Likewise, the normal high and normal low voltages applied to sense amplifier 22 via lines 24 and 26, respectively, as well as the balance of the sense amplifier, determine a normal sense amplifier voltage window that is essentially equal to the difference between these normal voltages when the sense amplifier is in balance. As will be discussed below, the signals applied to memory 11 by test circuitry 50 adjusts selected ones of these normal voltages, times and windows to different values as determined by signals input on inputs 53 and 59 and mode control circuit 52, which permits the likelihood of premature failure of individual cells to be ascertained, either relative to other cells or in more absolute terms, such as time or number of cycles. In this disclosure, the term "failure" means any material or physical property or change in performance that places an electrical or electronic parameter of the cell out of specification. "Likelihood of premature failure" generally means any indication that can reasonably be interpreted to suggest that failure may occur earlier than normal, but can also include relatively precise comparative probabilities or indications as to the probable time of failure.

Test circuitry 50 includeds mode control circuit 52, low-level voltage supply circuit 54, high-level plate supply circuit 56, high-level sense amplifier voltage supply 58, and voltage detect circuit 60. The high system voltage, Vcc, is applied to high-level plate supply circuit 56 via line 57, and the low system voltage, Vss, is applied to low-level voltage supply circuit 54. These Vcc and Vss inputs are expressly shown because they directly relate to the invention. As known in the art, the high or supply voltage Vcc and the ground or low voltage Vss are input to many other portions of memory 10 also. An external signal we shall call the "test mode signal" is input on line 53 to mode control circuitry 52 via and input device, preferably a pin (not shown). An external signal we shall call the "test voltage signal" is input on line 59 to voltage detect circuit 60 via an input device, preferably a pin (not shown). The test mode signal determines which of the normal voltages, normal times, and normal sense amplifier windows shall be adjusted and what the adjusted times will be; and the test voltage signal determines what the adjusted voltages will be. Mode control circuit 52 applies mode control signals to high-level plate supply 56, low-level plate supply 65, SAN driver and timing control 44, SAP driver and timing control 42, plate line driver and timing control 30, and word line driver and timing control 36, via lines 64, 65, 66, 68, 69 and 70, respectively. Voltage detect circuit 60 applies signals to high-level sense amplifier voltage supply 58, high-level plate voltage supply 56, and low-level voltage supply 54 via lines 61, 62, and 63, respectively. High-level sense amplifier voltage supply 58 applies a voltage determined by the signal on line 61 to SAP driver and timing control 42 on line 74. This voltage is also applied to the other SAP drivers and timing controls associated with the other columns of memory 11. High-level plate voltage supply 56 applies a voltage determined by the signal on line 63 to plate line driver and timing control 30 on line 75. This voltage is also applied to the other plate line drivers and timing controls associated with the other columns of memory 11. During a first portion of the read cycle, low-level sense amplifier voltage supply 54 applies a voltage to precharge driver and timing controls 38 and 40 on line 48. This voltage is also applied to the other precharge drivers and timing controls associated with the other columns of memory 11. During a second portion of the read cycle, low-level sense amplifier voltage supply 54 applies a voltage to SAN driver and timing control 44 on line 76. This voltage is also applied to the other SAN drivers and timing controls associated with the other columns of memory 11. The invention contemplates that there could be separate low-level supply circuits for SAN driver 44 and precharge drivers 38 and 40, as for the high-level case, or that one or more of the high-level drivers could be combined, as for the low-level case.

Figure 2:
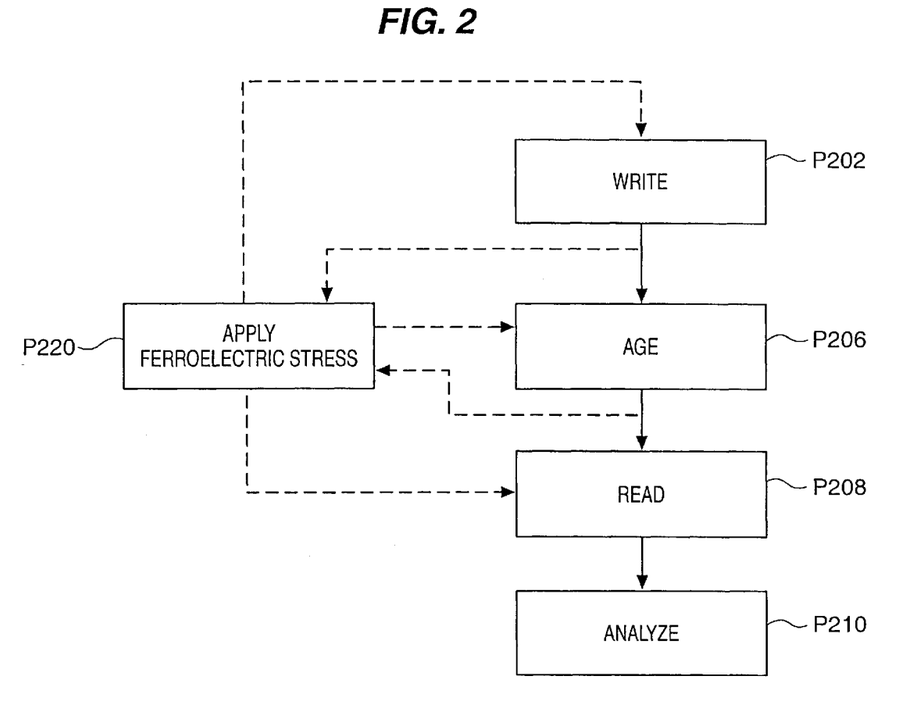
FIG. 2 shows a generalized flow chart of a preferred embodiment of a method for testing ferroelectric memories according to the invention.

Turning now to the operation of memory 10, and particularly test circuitry 50, FIG. 2 shows a generalized flow diagram of the operation of memory 10 and the method of the invention. In general, the process of the invention includes a write step P202, an optional age step P206, a read step P208, followed by an optional analysis step P210. In some embodiments, age step P206 is not included, and the analysis step may be performed separately by others. The invention also preferably includes a ferroelectric stress step P220, in which ferroelectric memory element 14 of memory 10 is stressed. Specific examples of such stress steps will be discussed below. FIG. 2 illustrates that this stress step may be performed at different times in the sequence of operations of the invention. It may be performed prior to write step P202, between write step P202 and age step P206, and between age step P206 and read step P208. The write step comprises placing a predetermined normal write voltage corresponding to either the logic "1" state or the logic "0" state across ferroelectric material 13 in memory cell 14 by applying appropriate voltages to bit lines 16 and 18 and plate line 20. The write step may be a partial write, i.e., a write step in which either the voltage applied to plate line 20, the voltage applied to one or both of bit lines 16 and 18, or both the plate and bit line voltages are adjusted in either amplitude or timing so that the write voltage across ferroelectric material 13 is reduced from the normal write voltage, the time during which the write voltage is applied is reduced, or the timing is changed so that it is not optimal. The bit line write voltages may be changed by altering the precharge voltage or timing or by altering the normal bit line write voltages. Read step P208 may be a partial read, i.e., a read step in which either the voltage applied to plate line 20, the voltage applied to one or both of bit lines 16 and 18, the voltage applied to sense amplifier 22 on one or both of lines 24 or 26, the balance of the sense amplifier 22 is changed, or any combination of, the plate, bit line, and sense amplifier voltages are adjusted in either amplitude or timing so that the read voltage across ferroelectric material 13 is reduced from the normal read voltage, the time during which the read voltage is applied is reduced, the ability of the sense amplifier to distinguish voltage differences between lines 16 and 18 is reduced, or the timing of any of the voltages is changed so that it is not optimal. The bit line read voltages may be changed by altering the precharge voltage or timing or by altering the normal bit line read voltages. The sense amplifier 22 may be imbalanced by applying an offset voltage to the sense amplifier. The partial read and partial write operations may also be provided simply by reducing Vcc for the whole chip. However, if ferroelectric material 13 can be read at a voltage that is less than the CMOS operating voltage, this last option will not work for a partial read. Also, it should be kept in mind that if the memory has a power-on-reset function, this function should usually be disabled during the test, since the partial reads and writes could otherwise trigger this function. In general, the term "partial" herein when referring to a write or read process means any such process in which a voltage amplitude or timing is outside the normal specified range.

Age step P206 usually comprises a heating step, but also may comprise placing the memory in storage for a significant time, subjecting it to radiation, or other process that tends to accelerate the decay of data in the memory cells. The ferroelectric stress step comprises any step which can stimulate ferroelectric failure, such as anomalous ferroelectric fatigue, anomalous imprinting, and anomalous shifting of parameters such as coercive voltage and polarizability, or other ferroelectric failure mechanism. Generally, stress step P220 comprises placing a stress voltage across ferroelectric material 13 in memory cell 14. The stress voltage may be at or higher than the coercive voltage, lower than the coercive voltage, and may be repeated. As known in the art, the coercive voltage generally is not a fixed voltage, but varies with temperature, voltage, and other parameters, and can depend on factors such as how often the ferroelectric has been pulsed. Thus, when the term "coercive voltage" is used, it means the coercive voltage under whatever the conditions a particular ferroelectric material experiences.

Figure 3:
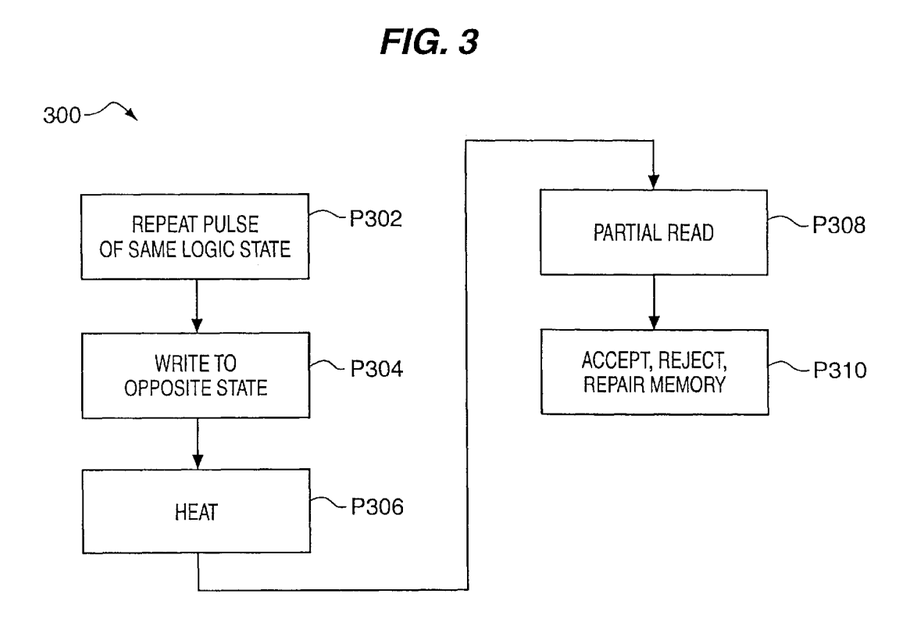
FIG. 3 shows a preferred implementation of the method of FIG. 2.

FIG. 3 shows a preferred implementation of a method 300 according to the invention. In step P302, ferroelectric stress is applied to the memory cells to be tested by repeated application of a voltage pulse of the same logic state. The same logic state means that each pulse is of the same direction. Preferably, the pulse is at or above the coercive voltage of the ferroelectric material, and, preferably, is repeated for from ten to one million times. As known in the art, such repeated pulsing tends to develop a set or imprint in the ferroelectric material, i.e., the material tends to return to the logic state of the stress pulse more easily than in a material that has not been so stressed. In step P304, the cells are written to the logic state that is opposite to the state of the stress voltage. In step P306, which is optional, the cells are aged by heating. The heating is preferably to a temperature of from 50° C. to 300° C. and most preferably to a temperature of from 70° C. to 250° C., and preferably is for a time of one hour to 50 hours, and most preferably an overnight bake of from 12 hours to 15 hours. After cooling down to room temperature, the cells are read with a partial read in step P308. The partial read is preferably attained by one or a combination of the following steps: the read voltage is made lower than normal by changing the plate voltage, resulting in partial switching of ferroelectric material 13; the read voltage is made lower than normal by changing the bit line precharge voltage, resulting in partial switching of ferroelectric material 13; the read time is made shorter than the normal read time, resulting in partial switching of the ferroelectric capacitor; and one or both of the sense amplifier voltages on lines 24 and 26 are changed or the sense amplifier is imbalanced to narrow the sense window. Here "sense window" refers to either the voltage window or the time window. In analysis step P310, the cells that fail this test, i.e., the cells that are not read in the proper logic state, are determined to have a greater chance of premature failure than the other cells, and the memory including the cells may be rejected or the cells repaired by appropriate processing steps. The cells that read in the proper logic state are determined to meet the quality requirements and are accepted. Analysis step P310 may not be performed by the same parties that perform the other test steps. For example, the cells that do not read properly may simply be recorded and the record passed to the user of the memory, who can then adapt the system in which the memory is used so that these cells cannot be addressed.

Figure 4:
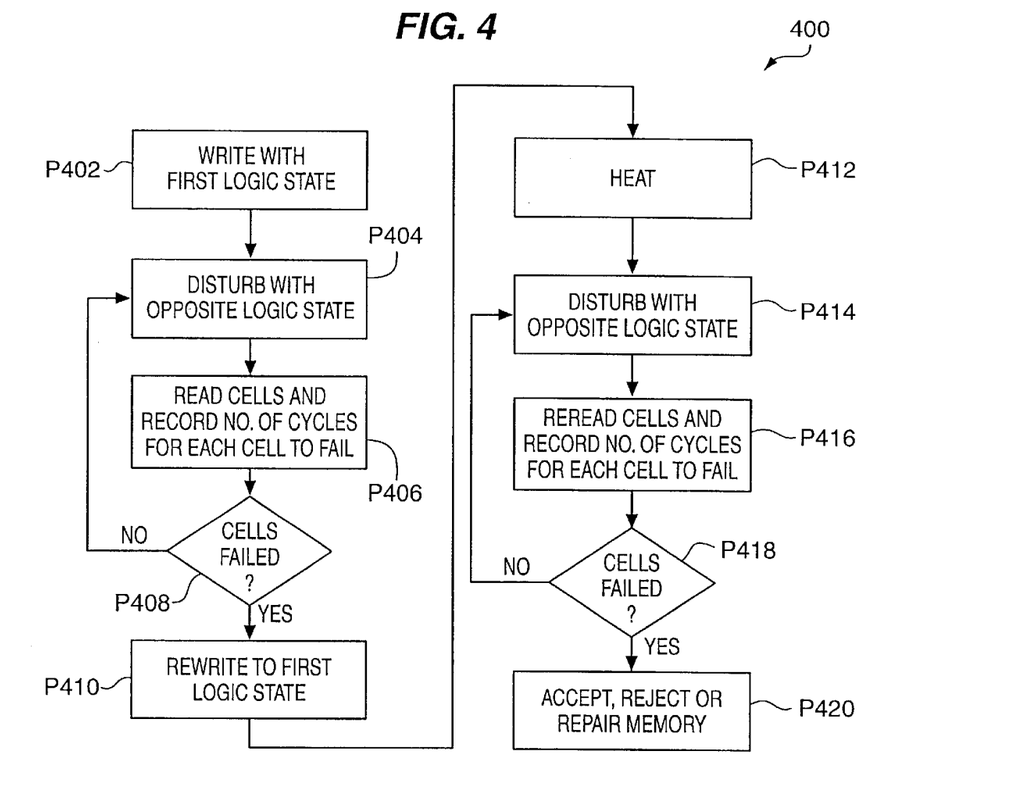
FIG. 4 shows another preferred implementation of the method of FIG. 2.

FIG. 4 shows another preferred implementation of a method 400 according to the invention. In step P402, the cells to be tested are written to a first logic state. In step P404, the cells are disturbed with a pulse of the opposite logic state, which pulse is less than the coercive voltage of ferroelectric material 13. Preferably, the pulse is from one-half to one-twentieth of the coercive voltage, and most preferably from about one-quarter to one-tenth of the coercive voltage. In step P406, the cells are read, and the number of disturb cycles for the cell to fail, i.e., to fail to read in the first logic state, is recorded. Steps P404 and P406 are repeated until all or a predetermined percentage of the cells have failed, as indicated at P408, and then the cells are rewritten to the first logic state in step P410. In step P412, the cells are heated. This heating step is preferably for the time and temperature ranges as described for the process of FIG. 3. In step P414, the cells are again disturbed with a pulse of the opposite logic state, which pulse is less than the coercive voltage of ferroelectric material 13. Preferably, the pulse is from one-half to one-twentieth of the coercive voltage, and most preferably from about one-quarter to one-tenth of the coercive voltage. In step P416, the cells are read, and the number of disturb cycles for the cell to fail, i.e., to fail to read in the first logic state, is recorded. Steps P414 and P416 are repeated until all or a predetermined percentage of the cells have failed, as indicated at P418. In step P420, for each cell, the number of cycles for the cell to fail recorded in step P406 is compared to the number of cycles for the cell to fail recorded in step P416. The cells for which the heating step decreased the number of cycles for the cells to fail more than a predetermined number of cycles are determined to have a greater chance of premature failure than the other cells, and the memory including the cells may be rejected or the cells repaired by appropriate processing steps. The cells for which the number of cycles to fail does not change between step P406 and P416, or for which the change is at or below the predetermined number of cycles, are determined to meet the quality requirements and are accepted. Again, analysis step P420 may not be performed by the same parties that perform the other test steps. For example, number of cycles to failure for each cell recorded in step P406 and step P416 may be passed to the user of the memory, who can then adapt the system in which the memory is used so that cells for which the numbers do not meet the user's requirements cannot be addressed. The predetermined decrease in number of disturb cycles that determines the accept or reject standard will depend on the magnitude and length of the disturb pulses applied in steps P404 and P414, the temperature and time of heating step P412, and many other factors. In practice, for this invention, the number is from one to ten cycles, and most preferably from two to four cycles.

Figure 5:
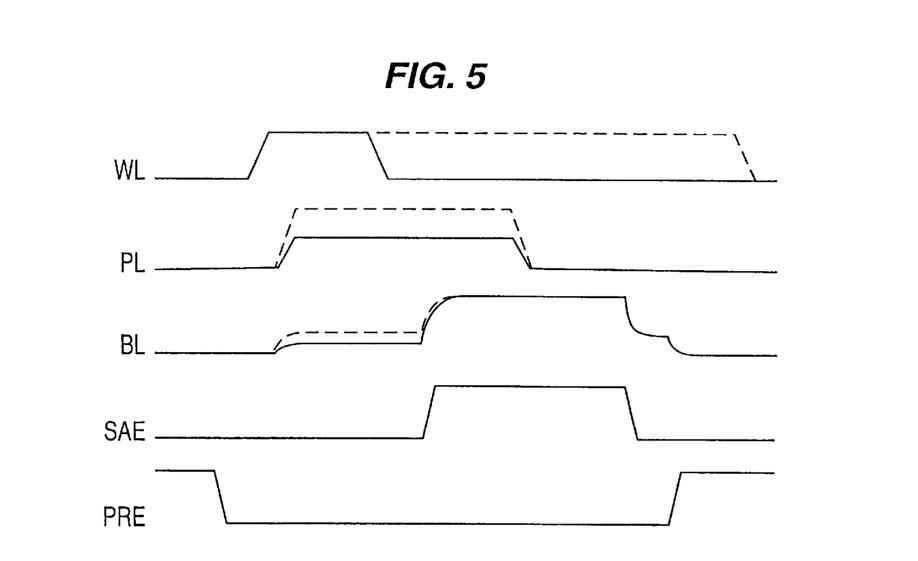
FIG. 5 shows a timing diagram of a portion of the method of FIG. 4.

FIG. 5 shows a timing diagram for the disturb pulse of steps P404 and P414. As known in the art, a timing diagram is a plot of the voltage signals of interest in an integrated circuit versus time, with the voltage generally plotted along the ordinate and the time plotted along the abscissa. Also as known in the art, timing diagrams are qualitative only: the times and voltages are not intended to be precise but are only shown in sufficient detail to approximately indicate the relative differences in voltage and timing between the various signals. In FIG. 5, the solid lines indicate the voltages and timing for the disturb cycle, while the dashed lines indicate the voltages and timing for a normal read and rewrite (or write) cycle. As indicated, the signal WL on word line 19 is brought low before the sense amplifier enable signal, SAE, on line 24 goes high to prevent ferroelectric material 13 from being rewritten. The signal PL on plate line 20 is reduced in amplitude such that full switching does not occur. The SAE and PRE charge signals do not change in this embodiment. The SAE signal timing is shown in relation to the plate line pulse, PL, for the read in step P406 and step P416 that occurs after each disturb pulse, or series of disturb pulses.

It should be understood that the above examples are just that—examples. The ferroelectric memory to which the invention is applied can differ significantly from that shown; for example, the memory cell could be a 1T/1C cell, a ferroelectric FET, a raw array, a disk memory, or other ferroelectric memory. For each type of memory, many different architectures may be used. For example, the discussion above has been in terms of an architecture in which the plate line is pulsed, but the invention may be applied in an architecture in which the plate line is held at ½ Vcc, or any other architecture. In each case, the various conducting lines and signals that operate the memory will change significantly. In addition, any combination of the various processes described above may be used. For example, a partial write process may be combined with a ferroelectric stress process, a partial write process with a heat process, a partial write process with a partial read process, a stress process with a partial read process, etc. That is, it should be understood that the drawings and specification of the present application disclose embodiments of the invention. Although specific terms are employed, they are used in a generic and descriptive sense only and not for purposes of limitation. It is expected that persons skilled in the art can and will make, use or sell alternative embodiments that are within the scope of the following claims either literally or under the Doctrine of Equivalents.

What is claimed is:

1. A method of testing a ferroelectric integrated circuit memory device comprising a plurality of memory cells, each including a ferroelectric material having a coercive voltage, said method comprising:

writing a known logic state to said memory cells without causing said cells to fail;

applying ferroelectric stress to said memory cells;

reading said memory cells to provide output data; and analyzing said output data to provide a test result indicative of the likelihood of premature failure for each of said memory cells.

2. A method as in claim 1 wherein said step of applying ferroelectric stress comprises applying a voltage pulse to said memory cells.

3. A method as in claim 2 wherein said step of applying a voltage pulse comprises a step selected from the group consisting of: repeatedly applying to said cells a voltage at or above said coercive voltage, and repeatedly applying to said cells a voltage lower than said coercive voltage.

4. A method as in claim 3 wherein said step of applying comprises said step of repeatedly applying to said cells a voltage at or above said coercive voltage and corresponding to a first logic state, and said step of writing comprises writing to a second logic state opposite to said first logic state.

5. A method as in claim 4 wherein said step of reading comprises performing a partial read of each of said memory cells.

6. A method as in claim 5 wherein said step of performing a partial read comprises a step selected from the group consisting of: reading said cells with a voltage lower than the normal read voltage for said memory cells; placing a read voltage across said ferroelectric material for a period of time that is shorter than the normal read time for said memory cells; and sensing the read output signal with a narrower than normal sense voltage window.

7. A method as in claim 6 wherein said memory includes a plurality of plate lines and a plurality of bit lines, and said step of reading said cells with a voltage lower than the normal read voltage comprises a step selected from the group consisting of: reducing the plate line voltage, and raising the bit line precharge voltage.

8. A method as in claim 3 wherein said step of writing comprises writing each of said cells to a first logic state and said step of applying comprises said first step of repeatedly applying to said cells a voltage below said coercive voltage and corresponding to a second logic state different than said first logic state.

9. A method as in claim 8 wherein said step of reading said cells to provide output data includes the step of recording the number of said first repetitions required for each of said cells to fail to read said first logic state in said read step.

10. A method as in claim 9 and further including the steps of rewriting said memory cells to said first logic state; heating said memory cells; a second step of repeatedly applying to said cells a voltage below said coercive voltage and corresponding to a second logic state different than said first logic state; and a second step of reading said cells and recording the number of said second repetitions required for each of said cells to fail to read said first logic state in said second read step.

11. A method as in claim 10 and further including the step of comparing said number of said first repetitions to said number of said second repetitions and accepting, rejecting or repairing said memory device based on said comparison.

12. A method as in claim 9 wherein said step of reading comprises performing a partial read of each of said memory cells.

13. A method as in claim 12 wherein said step of performing a partial read comprises a step selected from the group consisting of: reading said cells with a voltage lower than the normal read voltage for said memory cells; placing a read voltage across said ferroelectric material for a period of time that is shorter than the normal read time for said memory cells; and sensing the read output signal with a narrower than normal sense voltage window.

14. A method as in claim 13 wherein said memory includes a plurality of plate lines and a plurality of bit lines, and said step of reading said cells with a voltage lower than the normal read voltage comprises a step selected from the group consisting of: reducing the plate line voltage, and raising the bit line precharge voltage.

15. A method as in claim 1 wherein said step of reading comprises performing a partial read of each of said memory cells.

16. A method as in claim 15 and further including the step of heating said plurality of memory cells.

17. A method as in claim 1 and further including the step of heating said plurality of memory cells.

18. A method as in claim 1 wherein said step of writing comprises performing a partial write of each of said memory cells.

19. A method as in claim 1 and further including the step of accepting, rejecting or repairing said memory device based on said output data.

20. A method as in claim 19 wherein said step of reading comprises performing a partial read of each of said memory cells.

21. A method of testing a ferroelectric integrated circuit memory device comprising a plurality of memory cells, each including a ferroelectric material, said method comprising:

partially writing a known state to said memory cells;

heating said memory cells;

reading said memory cells to provide output data; and analyzing said output data to provide a test result indicative of the likelihood of premature failure for each of said memory cells.

22. A method as in claim 21 wherein said step of partially writing comprises a step selected from the group consisting of: writing said known value to said cells with a voltage lower than the normal write voltage for said memory cells; placing a write voltage across said ferroelectric material for a period of time that is shorter than the normal write time for said memory cells; and sensing a read output signal with a narrower than normal sense voltage window.

23. A method of testing a ferroelectric integrated circuit memory device comprising a plurality of memory cells, each including a ferroelectric material, said method comprising:

writing a known state to said memory cells;

heating said memory cells;

partially reading said memory cells; and analyzing said output data to provide a test result to provide output data indicative of the likelihood of premature failure for each of said memory cells.

24. A method as in claim 23 wherein said step of partially reading comprises a step selected from the group consisting of: reading said cells with a voltage lower than the normal read voltage for said memory cells; placing a read voltage across said ferroelectric material for a period of time that is shorter than the normal read time for said memory cells; and sensing the read output signal with a narrower than normal sense voltage window.

25. A method as in claim 23 wherein said step of writing comprises performing a partial write of each of said memory cells.

26. A ferroelectric memory device comprising: a plurality of ferroelectric memory cells; a ferroelectric test circuit for performing a process selected from the group consisting of: applying ferroelectric stress to said memory cells; performing a partial write of said ferroelectric memory cells; and performing a partial read of said ferroelectric memory cells.

27. A ferroelectric integrated circuit memory device, comprising:

a plurality of memory cells, each of said memory cells including a ferroelectric material;

a plurality of conducting lines, each of said lines connected to or connectable to a selected one of said memory cells;

a drive circuit for applying a predetermined voltage for a predetermined time to a selected one of said lines, said predetermined voltage and time being the normal voltage and time required to perform a function selected from the group of: writing a logic state to said selected memory cell, and reading said selected memory cell; and a mode control circuit responsive to an external signal for adjusting said predetermined voltage or said predetermined time to perform an operation selected from the group consisting of: a partial read of said selected memory cell; a partial write of said selected memory cell; and applying ferroelectric stress to said memory cell.

28. A ferroelectric memory device as in claim 27 wherein said conducting lines comprise plate lines, said predetermined voltage comprises a plate line voltage, and said drive circuit comprises a plate line drive circuit.

29. A ferroelectric memory device as in claim 28 wherein said mode control circuit comprises a voltage control circuit for lowering said plate line voltage.

30. A ferroelectric memory device as in claim 29 wherein said conducting lines further include word lines for carrying a word line signal and said mode control circuit comprises a timing control circuit for changing the timing of said word line signal.

31. A ferroelectric memory device as in claim 27 wherein said conducting lines comprise bit lines, said predetermined voltage comprises a precharge voltage, and said drive circuit comprises a bit line precharge circuit.

32. A ferroelectric memory device as in claim 31 wherein said mode control circuit comprises a voltage control circuit for raising said precharge voltage.

33. A ferroelectric memory device as in claim 27 wherein said conducting lines comprise sense amplifier voltage lines, said predetermined voltage comprises a sense amp voltage, and said drive circuit comprises a sense amplifier voltage drive circuit.

34. A ferroelectric memory device as in claim 33 wherein said conducting lines comprise a high sense amplifier voltage line and a low sense amplifier voltage line, said sense amplifier voltage includes a high sense amplifier voltage and a low sense amplifier voltage, and said mode control circuit comprises a voltage control circuit for narrowing the voltage window between said high sense amplifier voltage and said low sense amplifier voltage.

35. A ferroelectric memory device as in claim 27 wherein said conducting lines include word lines for carrying a word line signal, and said mode control circuit comprises a timing control circuit for changing the timing of said word line signal.

* * * * *